July 3, 1973 R. N. CASTONGUAY 3,743,583

PRINTED CIRCUIT BOARD FABRICATION

Filed Jan. 15, 1971 2 Sheets-Sheet 1

INVENTOR
RICHARD N. CASTONGUAY

BY

Finkelstein & Mueth
ATTORNEYS

INVENTOR
RICHARD N. CASTONGUAY
BY
Finkelstein & Mueth
ATTORNEYS

United States Patent Office 3,743,583

Patented July 3, 1973

3,743,583

PRINTED CIRCUIT BOARD FABRICATION

Richard N. Castonguay, Los Angeles, Calif., assignor to The Mica Corporation, Culver City, Calif.

Filed Jan. 15, 1971, Ser. No. 106,832
Int. Cl. C23g 5/32, 5/48, 5/68
U.S.Cl. 204—27 4 Claims

ABSTRACT OF THE DISCLOSURE

A novel method of producing a printed circuit board material having a substrate carrying superposed resistive material and conductive metal layers which comprises depositing the resistive layer on a preformed conductive metal film, the improvement wherein the resistive layer is deposited on said preformed conductive metal layer in a plating bath having an anode and wherein the preformed conductive metal film is the cathode, and wherein the resistive material is deposited slowly from a dilute plating solution in a quiescent state by the use of a tunnel positioned within the bath between the anode and cathode to regulate turbulence within the bath between said anode and cathode, and prevent diffusion into the enclosed area of the bath.

The present invention further comprises the novel apparatus for carrying out the foregoing process which comprises a plating bath having a resistive metal anode and a preformed conductive metal film cathode, a plating solution within said bath comprising a salt of said resistive material, positioned between said anode and cathode, a tunnel comprising a box-like structure open at the ends in proximity to said anode and cathode and otherwise closed by generally parallel, horizontal and vertical sheet members which abut at the edge, said tunnel being adapted to control the turbulence of the plating solution within said bath, and to prevent diffusion into the enclosed area of said bath.

BACKGROUND OF THE INVENTION

The present invention pertains to the preparation of printed circuit board materials having conductive and resistive metal layers.

In the currently widely used method of manufacturing printed circuits, the fabricator starts with a conductively clad insulating sheet, chemically etches the desired pattern of conductor lines, and then affixes the additional required circuit components to the conductor lines by various means. Commonly used insulating substrates are composed of thermosetting or thermoplastic synthetic resins—either unreinforced or reinforced with paper, mats, chopped strands, or woven fabrics of various compositions. Using these substrates, the required additional circuit components referred to previously are affixed to the circuit by inserting their electrical leads into holes which must be positioned and drilled precisely to insure that the soldering or welding operation which follows will make proper electrical contact. In addition to the necessity for precision hole drilling, this fabrication method requires that components be purchased, inventoried, selected, mounted on the substrate, and soldered: with resultant component costs, assembly time; and increased circuit volume requirements caused by the size of the components. Some of the foregoing problems can be circumvented by use of ceramic substrates on which components—particularly resistors—can be screened and fired (thick film resistors) or deposited in vacuo by such means as thermal evaporation, electron beam evaporation, sputtering, or ion plating (thin film resistors). This approach suffers from the need for expensive conductive and resistive pastes, the need for firing, and associated expensive equipment in the case of thick films; and the requirement for highly expensive vacuum systems, slow cycle time, and extremely precise process control with the vacuum techniques. Both thick and thin film processes as described above are at further disadvantage owing to the necessity to use ceramic substrates which are expensive, available in relatively small sizes, and can be drilled only with difficulty—usually in the green, or unfired state. Prior to circuit definition, the ceramic chips or wafers must be fired at extremely high temperatures in order to develop their ultimate properties.

More recently, it has been proposed to form printed circuit board material by applying a resistive layer to a preformed conductive layer, and laminating the resistive layer to a substrate. An improved method of this type is disclosed in assignee's United States patent application Ser. No. 850,248, filed Aug. 14, 1969, the disclosure of which is expressly incorporated herein by reference.

SUMMARY OF THE INVENTION

Briefly, the present invention describes a novel method of producing a printed circuit board material having a substrate carrying superposed resistive material and conductive metal layers which comprises depositing the resistive layer on a preformed conductive metal film, the improvement wherein the resistive layer is deposited on said preformed conductive metal layer in a plating bath having an anode and wherein the preformed conductive metal film is the cathode, and wherein the resistive material is deposited slowly from a plating solution in a quiescent state by the use of a tunnel positioned within the bath between the anode and cathode to regulate turbulence within the bath between said anode and cathode, and to prevent diffusion into the enclosed area of said bath.

The resistive layer preferably is an electrodeposited nickel-phosphorous alloy.

In a preferred embodiment of this invention, the preformed conductive metal film is coated with a porous polymeric member prior to plating so that the deposit of the resistive material occurs through the membrane. The membrane is subsequently removed prior to the lamination of the coated metal film to the substrate of the printed circuit board material.

The present invention further comprises the novel apparatus for carrying out the foregoing process which comprises a plating bath having an anode and a preformed conductive metal film cathode, a plating solution within said bath including at least one material which is adapted to form a resistive deposit on said film cathode, positioned between said anode and cathode, a tunnel comprising a box-like structure open at the ends in proximity to said anode and cathode and otherwise closed by generally parallel, horizontal and vertical sheet members which abut at the edges, said tunnel being adapted to control the turbulence of the plating solution within said bath, and to prevent diffusion into the enclosed area of said bath.

It is an object of the present invention to provide a novel method of producing printed circuit stock material from which can be produced by selective etching techniques, patterns of electrical conductors and resistors.

It is a further object of the present invention to provide said stock material utilizing a novel plating bath structure.

It is a further object of the present invention to manufacture printed circuit board material having improved and more reproducible properties.

It is a further object of the present invention to manufacture printed circuit board material in which the resistive metal is deposited slowly under conditions of restricted diffusion.

It is still a further object of the present invention to manufacture printed circuit board material in which the resistive metal is deposited slowly under non-turbulent conditions.

Yet another object of the present invention is to manufacture said stock material so that electrical resistors and conductors can be selectively etched in such a manner as to be in electrical contact with each other, thus obviating the need for further electrical connections, e.g. wires and/or solder, between conductors and resistors.

These and other objects and advantages of my invention will be apparent from the detailed description which follows.

DESCRIPTION OF THE PREFERRED EMBODIMENTS

Turning to the drawings.

Figure 1:
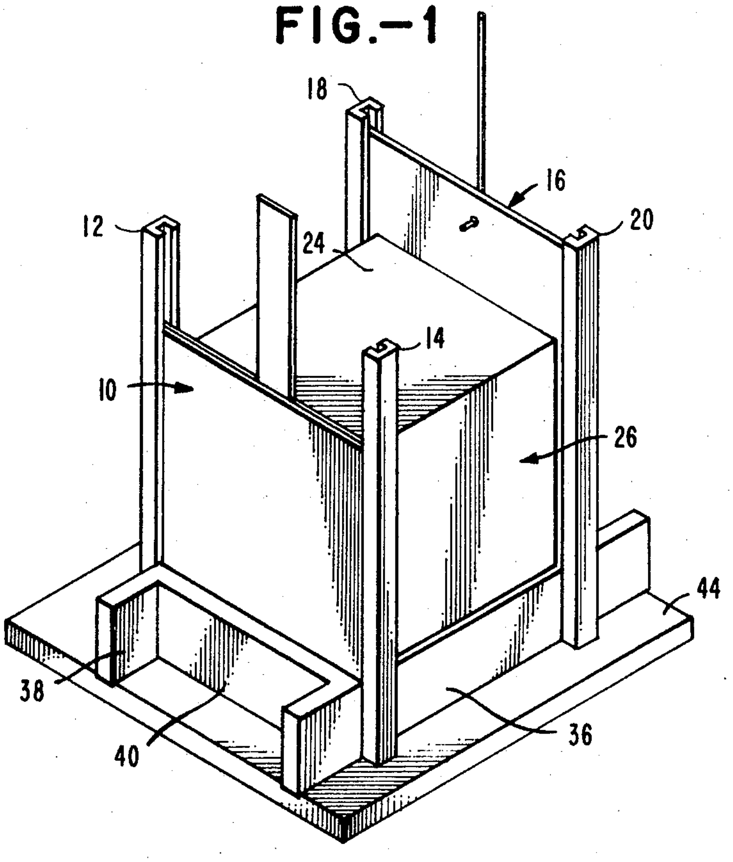
FIG. 1 is a perspective view of the electrode assembly, tunnel and associated supporting structure.
Figure 2:
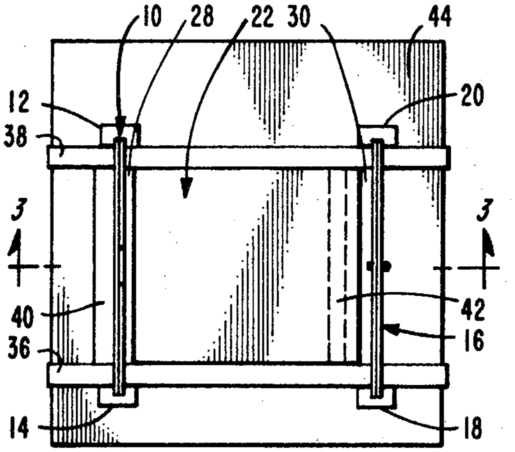
FIG. 2 is a top plane view of the structure shown in FIG. 1.
Figure 3:
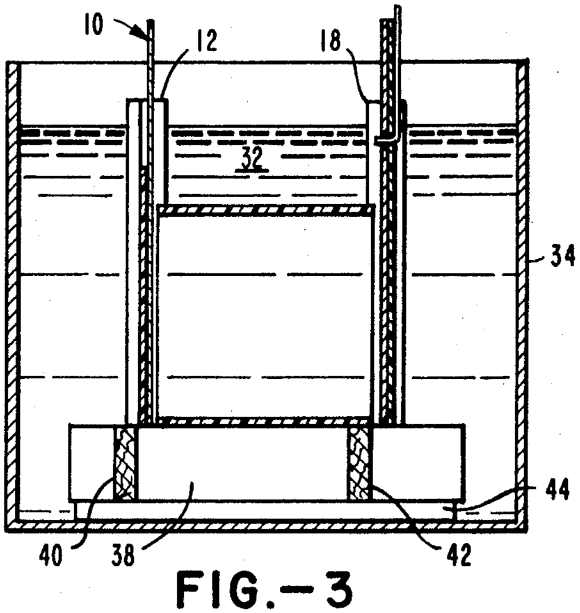
FIG. 3 is a sectional view of a plating bath containing the structure shown in FIGS. 1 and 2, taken along the line 2—2 in FIG. 2.
Figure 4:
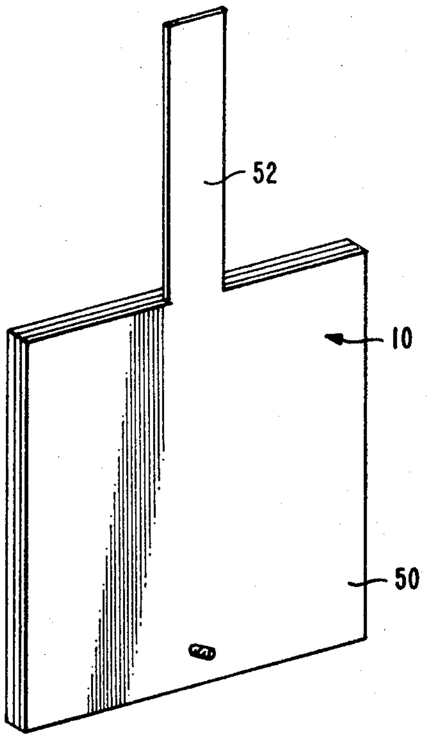
FIG. 4 is a perspective view of the cathode assembly used in the structure shown in FIGS. 1–3.
Figure 6:
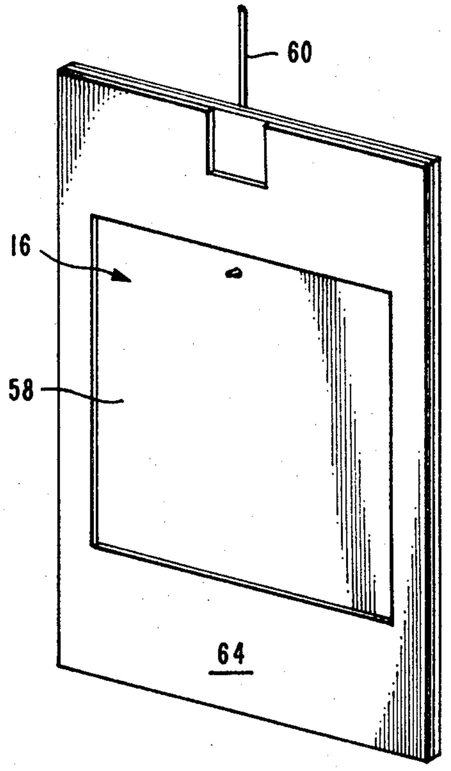
FIG. 6 is a perspective view of the anode assembly used in the structure shown in FIGS. 1–3.
Figure 5:
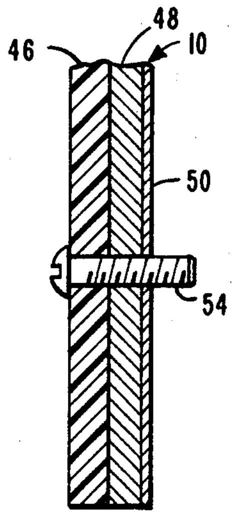
FIG. 5 is a partial section taken through the cathode assembly of FIG. 4.
Figure 7:
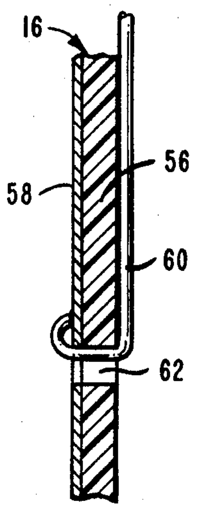
FIG. 7 is a partial section taken through the anode assembly of FIG. 6.

In the present invention, the invention can be practiced as shown in the drawings. However, numerous variations and modifications of the structure shown will be apparent to those skilled in the art, and hence are within the contemplation of my invention.

In the drawings the cathode assembly 10 is received and held by the slotted upright members 12 and 14. The anode assembly 16 is held in similar fashion by members 18 and 20. The tunnel is indicated generally by the numeral 22 and comprises parallel horizontal sides 24 and parallel vertical sides 26. The tunnel is open at each of its ends which are in proximity to the cathode assembly 10 and the anode assembly 16. The tunnel 22 is slightly shorter in length than the distance between the cathode assembly 10 and the anode assembly 16 to provide gaps 28 and 30 between the end of tunnel 22 and said assemblies. The gaps 28 and 30 allow the solution 32 within the bath tank 34 to flow into and drain out of the tunnel. The tunnel 22 is carried by a tunnel support comprising side members 36 and 38, and parallel cross members 40 and 42. The tunnel support is affixed to base member 44 which serves as a brace.

The cathode assembly 10 comprises a rigid fiber glass-reinforced plastic back-up plate 46, a silicone rubber seal 48 and conductive copper foil 50. The foil 50 includes the extension 52. These elements are held in juxtaposed position by fastener 54 which is also received in cross member 40 to maintain the cathode assembly 10 firmly in place during operation of the bath.

The anode assembly 16 comprises a rigid plastic backing plate 56 to which is clad the nickel film or other anodic material such as carbon or graphite 58. The insulated electric wire 60 passes through hole 62 to contact film 58. The edge areas 64 are masked off with an acid resistant adhesive tape.

The power supply to the anode and cathode assemblies can be of any conventional type, and hence is not illustrated in the drawings.

The preferred plating bath used in this invention has the following composition:

| | MICA | |
|---|---|---|
| | G./l. | M./l. |
| Nickel sulfate hexahydrate | 37.50 | 0.143 |
| Nickel chloride hexahydrate | 11.25 | 0.048 |
| Nickel carbonate | 7.12 | 0.060 |
| Phosphoric acid (as 100% acid) | 12.25 | 0.125 |
| Phosphorous acid | 7.50 | 0.092 |
| Dowfax 2A1, ml | 0.11 | --- |
| Water | (1) | (1) |
| Concentration of nickel ion in mols per liter | | 0.25 |

[1] Make up to one liter.

The anode typically, although not necessarily, is a 7″ x 11″ one ounce per square foot electrolytically deposited nickel foil laminated to a 1/16″ thick epoxy fiber glass board. The anode may also be an inert material such as carbon or graphite, in which case no nickel is present in the anode. The cathode is preferably electrolytic copper foil. Dimensions for use with the abovementioned anode are 6½″ x 7″ with a 1″ wide strip extending 5″ perpendicular to the center of one of the 6½″ sides.

In general, the tunnel is a tube of rectangular cross section mounted between the anode and cathode. It serves to hold constant during plating that portion of the bath contained within it. While not bound by any theory, it is believed that this device controls diffusion—a phenomenon in strong evidence in this bath, and minimizes turbulence.

The electrode assembly is mounted in the bath by sliding the long edges of the anode and cathode backup boards into the slotted uprights 12, 14, 18 and 20. The base plate and the vertical holder braces can be maintained in the bath permanently.

After the electrolytic copper foil has been coated by electroplating in the bath with nickel-phosphorus on the matte or "solution" side of the foil, this now double layer foil is laminated, nickel-phosphorus side at the interface, with several plies of fiber glass fabric preimpregnated with an appropriate formulation of B-staged epoxy resins. The lamination process is well known to those skilled in the art. Following lamination, the copper surface is coated wth photoresist. This layer of photoresist is then exposed through a photographic negative containing the negative image of the combined resistor and conductor patterns. The exposed resist is developed, and the unexposed portion washed away. The panel with the developed image is then etched in an alkaline etchant until the bare copper is removed. The panel is then rinsed in water and immersed in an acid etchant until the bare nickel-phosphorus is removed. The remaining exposed photoresist is stripped off and the panel is coated with a new layer of photoresist. This layer is exposed through a photographic negative containing the negative image of the conductor pattern. The exposed resist is developed, and the unexposed portion washed away. The panel with the developed image is then etched in an alkaline etchant until the bare copper is removed. The panel is then rinsed in water and dried. At this point, the conductive and resistive patterns are individually defined, and in appropriate electrical contact with each other.

The general procedure as detailed here and further in the example which follows contemplates the use of photographic negatives and negative working resists. It should be noted specifically that other processing materials, well known to those skilled in the art of printed circuit manufacture, are also suitable. For instance, photographic positives can be used in combination with positive working resists (e.g. PR–102 by General Aniline & Film Corporation). Silk screening techniques can also be used in conjunction with any resist that is not attacked by the etchants.

The following example is presented solely to illustrate the invention and should not be regarded as limiting in any way.

EXAMPLE

The shiny or drum side of the copper is coated with a strippable vinyl coating. The copper is cut to the size. The plating bath, made up as previously indicated, is heated to 170° F. with constant agitation. The nickel anode is mounted in its vertical holder brace and attached to the power supply. The copper is immersed in 20 percent hydrochloric acid for 3 minutes, and then rinsed twice in distilled water. The copper is fastened to the electrode backup plate. The copper cathode assembly is mounted in its vertical holder brace in the bath, and the agitation is stopped. The power supply is attached to the protruding copper strip and the cathode assembly is allowed two minutes to equilibrate with the temperature of the bath. The power supply, having been preadjusted for the desired current and voltage is turned on for the appropriate plating period and then turned off, in this case a current density of 1.08 amps per square decimeter for 60 seconds gives a sheet resistivity of 50 ohms per square. The bath is allowed to stand one minute before removing the cathode assembly. The cathode assembly is taken apart and the now plated copper foil separated. The copper foil is rinsed first in tap water, then in distilled water at 190° F. The plated foil is dried in a stream of warm air. The strippable coating is removed from the unplated copper surface. The plated foil, plated side down, is stacked atop several layers of fiber glass fabric, preimpregnated with an appropriate formulation of epoxy resins. Using techniques well known to those skilled in the art, the assemblage is cured in a steam heated hydraulic press under heat and pressure to produce an epoxy-fiber glass laminate, clad on one side with the plated foil made as described above. The copper surface of the panel is coated with photoresist (Kodak KPR). The photoresist is exposed through a photographic negative of the combined conductor and resistor patterns. The resist is developed and the unexposed portions washed away. The panel is immersed in an alkaline etchant such as MacDermid's MU to remove the copper in the areas not covered by photoresist. The panel is immersed in an acid etchant such as MacDermid's Metex ZDC to remove the exposed resistive material. The panes is rinsed in water, the remaining photoresist stripped off, and a new layer of photoresist applied. The photoresist is exposed through a photographic negative of the conductor pattern. The resist is developed and the unexposed portions washed away. The panel is immersed in an alkaline etchant such as MacDermid's MU to remove the copper in the areas not covered by photoresist. The panel is rinsed in water and the remaining photoresist stripped off. The resistor-conductor pattern is now complete. Typical properties of resistors made by foregoing process:

| | |
|---|---|
| Sheet resistivity | 50 ohms per square. |
| Thermal coefficient of resistivity (−65° C. to +125° C.) | 50 p.p.m. |
| Resistor reproducibility on 4″ x 4″ panel | ±15%. |
| Power dissipation | 25 watts per square inch. |

As will be evident to those skilled in the art, the bath of the present invention is operated at abnormally low currents and concentrations of the various ions. In the prior art, the current density usually is within the range of from 5 to 40 amperes per square decimeter to 10 to 160 amperes per square decimeter (Brenner, Electrodeposition of Alloys, vol. II, pp. 460 and 466, Academic Press, New York, 1963). In contrast thereto, in the present invention the current density is about 0.75 to 1.25 amperes per square decimeter, or more generally, about one-fifth of the lowest current densities previously used in plating baths of the instant type.

The concentrations of metal ions, i.e., nickel, in the plating bath of my invention are about one-third to one-fourth of the metal ion concentrations previously used. Thus, in the present invention the nickel ion concentration in the bath is typically about 0.20 to 0.35 mole per liter. Compare, Brenner cited above, at page 459. In the present invention, the concentration of the other ingredients in the plating bath such as phosphoric acid and surfactant are also proportionately less.

The present invention is applicable to printed circuit board material generally. Thus, in addition to the utilization previously described, the present invention is applicable to polyfunctional laminates in multilayer circuit boards, whereby several layers of resistor-conductor patterns are laminated together and interconnected. It is also contemplated that a layer of copper foil be inserted directly under the top laminate ply which is in contact with the plated foil. In this way, a built-in heat sink for the resistors lying along the surface is provided.

Having fully described the invention it is intended that it be limited only by the lawful scope of the appended claims.

I claim:

1. A method of producing a printed circuit board material having a substrate carrying superposed resistive material and conductive metal layers which comprises depositing the resistive layer on a preformed conductive metal film, the improvement wherein the resistive material is deposited on said preformed conductive metal layer in a plating bath having an anode and wherein the preformed conductive metal film is the cathode, and wherein the resistive material is deposited slowly from a plating solution comprising phosphorous acid, phosphoric acid and nickel ion, the nickel ion concentration in said solution being from about .20 to .35 mole per liter in a quiescent state by the use of a tunnel positioned within the bath between the anode and cathode to regulate turbulence within the bath between said anode and cathode, and prevent diffusion into the enclosed area of the bath, said bath being maintained at a current density within the range of from about 0.75 to 1.25 amperes per square decimeter.

2. A method of producing a printed circuit board material having a substrate carrying superposed resistive material and conductive metal layers which comprises depositing the resistive layer on a preformed conductive metal film, said film containing a porous polymeric membrane thereon, the improvement wherein the resistive material is deposited on said preformed conductive metal layer in a plating bath having an anode and wherein the preformed conductive metal film is the cathode, and wherein the resistive material is deposited slowly from a plating solution comprising phosphorous acid, phosphoric acid and nickel ion, the nickel ion concentration in said solution being from about .20 to .35 mole per liter in a quiescent state by the use of a tunnel positioned within the bath between the anode and cathode to regulate turbulence within the bath between said anode and cathode, and prevent diffusion into the enclosed area of the bath, said bath being maintained at a current density within the range of from about 0.75 to 1.25 amperes per square decimeter.

3. A method of producing a printed circuit board material having a substrate carrying superposed resistive material and conductive metal layers which comprises depositing the resistive layer on a preformed conductive metal film, said film containing a porous polymeric membrane thereon, the improvement wherein the resistive material is deposited on said preformed conductive metal layer in a plating bath, said bath being dilute in ionic material, said bath having an anode and wherein the preformed conductive metal film is the cathode, and wherein the resistive material is deposited slowly from a plating solution comprising phosphorous acid, phosphoric acid and nickel ion, the nickel ion concentration in said soluiton being from about .20 to .35 mole per liter in a quiescent state by the use of a tunnel positioned within the bath between the anode and cathode to regulate turbulence within the bath between said anode and cathode, and prevent diffusion into the enclosed area of the bath, said bath being maintained at a current density within the range of from about 0.75 to 1.25 amperes per square decimeter.

4. A method of producing a printed circuit board material having a substrate carrying superposed resistive material and conductive metal layers which comprises depositing the resistive layer on a preformed conductive metal film, said film containing a porous polymeric membrane thereon, the improvement wherein the resistive material is deposited on said preformed conductive metal layer in a plating bath, said bath being dilute in ionic material, said bath having an anode and the preformed conductive metal film is the cathode, and wherein the resistive material is deposited slowly from a plating solution comprising phosphorous acid, phosphoric acid and nickel ion, the nickel ion concentration in said solution being from about .20 to .35 mole per liter in a quiescent state by the use of a generally rectangular tunnel positioned within the bath between the anode and cathode to regulate turbulence within the bath between said anode and cathode, and prevent diffusion into the enclosed area of the bath, said bath being maintained at a current density within the range of from about 0.75 to 1.25 amperes per square decimeter.

References Cited

UNITED STATES PATENTS

| | | | |
|---|---|---|---|
| 2,526,951 | 10/1950 | Kiefer | 204—DIG. 7 |
| 2,643,221 | 6/1953 | Brenner et al. | 204—43 |
| 2,644,787 | 7/1953 | Bonn et al. | 204—43 |
| 2,739,107 | 3/1956 | Ricks | 204—43 X |
| 3,152,974 | 10/1964 | Zentner | 204—43 |
| 3,475,293 | 10/1969 | Haynes et al. | 204—48 |
| 3,530,049 | 9/1970 | Scherzer et al. | 204—43 |

FOREIGN PATENTS

| | | | |
|---|---|---|---|
| 451,001 | 7/1936 | Great Britain | 204—DIG. 7 |
| 22,846 | 1964 | Japan | 204—DIG. 7 |

F. C. EDMUNDSON, Primary Examiner

U.S. Cl. X.R.

204—43 P, 242, DIG. 7